(12) United States Patent
Huang et al.

(10) Patent No.: US 9,184,054 B1
(45) Date of Patent: Nov. 10, 2015

(54) METHOD FOR INTEGRATED CIRCUIT PATTERNING

(71) Applicant: Taiwan Semiconductor Manufacturing Company, Ltd., Hsin-Chu (TW)

(72) Inventors: Tsung-Min Huang, Taichung (TW); Chih-Tsung Shih, Hsinchu (TW); Chung-Ju Lee, Hsinchu (TW); Chieh-Han Wu, Kaohsiung (TW); Shinn-Sheng Yu, Hsinchu (TW); Jeng-Horng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/262,484

(22) Filed: Apr. 25, 2014

(51) Int. Cl.
*H01L 21/76* (2006.01)
*H01L 21/033* (2006.01)

(52) U.S. Cl.
CPC ........ *H01L 21/0337* (2013.01); *H01L 21/0332* (2013.01)

(58) Field of Classification Search
CPC ................ H01L 21/0337; H01L 21/0332
USPC .................... 438/702; 430/315, 314
See application file for complete search history.

(56) References Cited

U.S. PATENT DOCUMENTS

| 7,015,136 B2 * | 3/2006 | Bao et al. ............. 438/638 |
| 2007/0020921 A1 | 1/2007 | Chu et al. |

OTHER PUBLICATIONS

Maaike Op De Beeck et al., "Manufacturability Issues with Double Patterning for 50nm Half Pitch Single Damascene Applications, Using Relacs® Shrink and Corresponding OPC,"Proc of SPIE vol. 6520, 65200I, (2007), 13 pages, Optical Microlithography XX.

* cited by examiner

*Primary Examiner* — Caleen Sullivan
(74) *Attorney, Agent, or Firm* — Haynes and Boone, LLP

(57) ABSTRACT

Provided is a method of patterning a substrate. The method includes forming a resist layer over the substrate, wherein a layer of resist scum forms in between a first portion of the resist layer and the substrate. The method further includes patterning the resist layer to form a plurality of trenches in the first portion, wherein the layer of resist scum provides a floor for the plurality of trenches. The method further includes forming a first material layer in the plurality of trenches, wherein the first material layer has a higher etch resistance than the resist layer and the layer of resist scum. The method further includes etching the first material layer, the resist layer, and the layer of resist scum, thereby forming a patterned first material layer over a patterned layer of resist scum over the substrate.

20 Claims, 6 Drawing Sheets

METHOD FOR INTEGRATED CIRCUIT PATTERNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring IC designs to a semiconductor substrate. A typical lithography process includes coating a resist (or photo resist) over the substrate, exposing the resist to a radiation such as extreme ultraviolet (EUV) ray, and developing and partially stripping the resist to leave a patterned resist over the substrate. The patterned resist is used for subsequent etching processes in forming ICs. Advancement in lithography is generally desirable to meet the demand of the continued semiconductor miniaturization.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
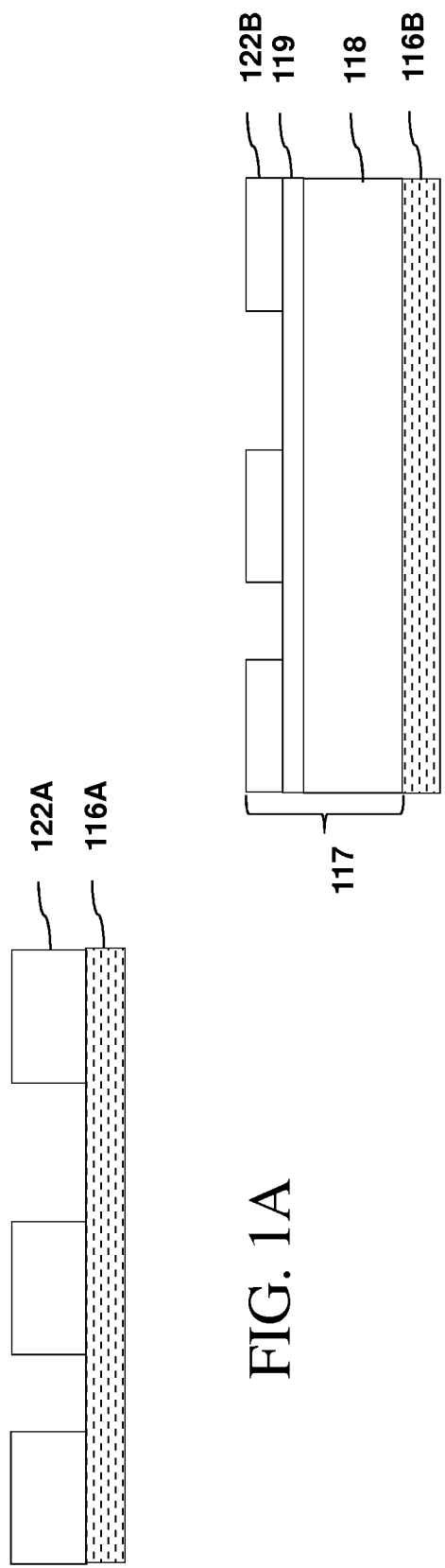
FIGS. 1A and 1B illustrate different approaches in lithography patterning.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to forming a pattern or device for an integrated circuit (IC) using a lithography process, and more particularly, to patterning a photoresist (resist) layer over a substrate wherein the resist layer includes a layer of resist scum.

FIGS. 1A and 1B illustrate some typical photolithography processes. FIG. 1A illustrates a single layer lithography patterning process where a resist layer 122A is formed over a hard mask layer 116A and is patterned with an IC design layout. The resist layer 122A can be a positive resist or a negative resist. A positive resist is normally insoluble in a resist developer, but is made soluble by exposure to a radiation. A negative resist has the opposite behavior. For the sake of example, the resist layer 122A is a positive resist. A typical patterning process includes coating the resist layer 122A over the hard mask layer 116A, soft baking the resist layer 122A, and exposing the resist layer 122A to a radiation using a mask. The process further includes post-exposure baking, developing, and hard baking thereby removing exposed portions of the resist layer 122A and leaving unexposed portions thereof on the hard mask layer 116A as a pattern. An etching process is subsequently followed, which etches the hard mask layer 116 using the patterned resist layer 122A as an etch mask thereby transferring the pattern to the hard mask layer 116A. Further steps are performed to transfer the pattern to a substrate (not shown) over which the hard mask layer 116A is formed. In some instances, issues may arise with the single layer lithography patterning process discussed above. One issue is that, due to undesirable aspect ratio of the resist patterns thus formed, the resist patterns are susceptible to collapsing. This can be explained as follows. On the one hand, since the resist layer 122A is typically consumed faster than the hard mask layer 116A when etching the hard mask layer 116A, a thick layer of the resist is generally coated. On the other hand, as semiconductor feature sizes continue to shrink, the width of some resist patterns become smaller and smaller, resulting in skinny and tall resist patterns, which may easily collapse during subsequent processing, such as cleaning. Another issue is that the resist layer 122A may not adhere to the hard mask layer 116A very well, which further contributes to the collapsing of the resist patterns.

FIG. 1B illustrates a tri-layer lithography patterning process where a tri-layer stack 117 is formed over a hard mask layer 116B. The tri-layer stack 117 includes a bottom material layer 118, a middle material layer 119, and a resist layer 122B. In this process, the resist layer 122B is primarily used for imaging and not masking, wherein the pattern from the resist layer 122B is transferred to the layers 119 and 118 which act as an etch mask for subsequently etching the hard mask layer 116B. As a result, the resist layer 122B may be made thinner than the resist layer 122A of the FIG. 1A to avoid the aforementioned aspect ratio problem. However, there remains the adhesion issue between the resist layer 122B and the middle material layer 119 and the resist pattern collapsing issue is not completely prevented. In addition, the tri-layer stack 117 generally costs more than the single layer resist 122A.

The present disclosure provides various embodiments of a method of lithography patterning which is more cost effective than the tri-layer lithography of FIG. 1B while preventing the patterned resist layer from collapsing. This is very desirable for advanced process nodes, such as 45 nanometer (nm), 28 nm, or smaller, where resist patterns have become narrower due to smaller feature sizes to be realized.

Figure 2:
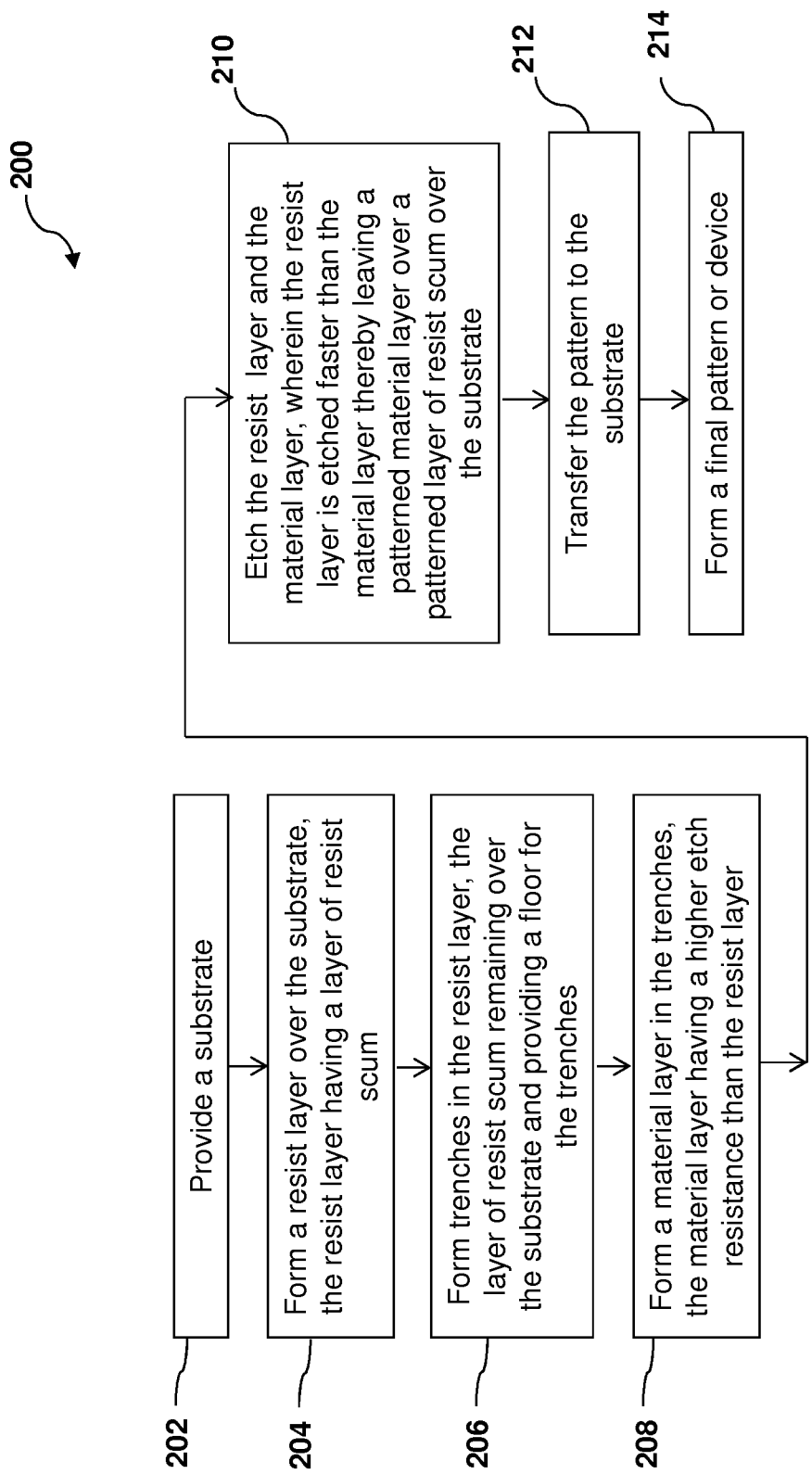
FIG. 2 is a flow chart of a method of forming a target pattern or device on a substrate for implementing one or more embodiments of the present disclosure.

Referring now to FIG. 2, a flow chart of a method 200 for forming a target pattern or device according to various aspects of the present disclosure is illustrated. Additional operations can be provided before, during, and after the method 200, and some operations described can be replaced, eliminated, or moved around for additional embodiments of the method. The method 200 is an example, and is not intended to limit the present disclosure beyond what is explicitly recited in the claims. The method 200 will be further described below in conjunction with FIGS. 3A-3F and FIGS. 4A-4B.

Figure 3A:
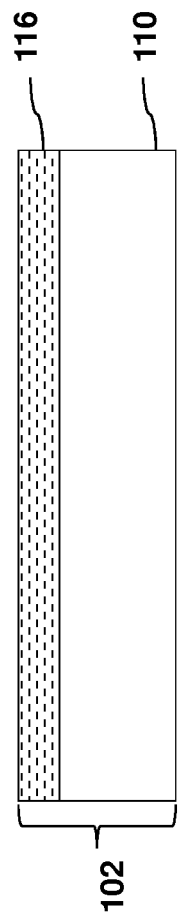
FIGS. 3A-3F are cross sectional views of forming a target pattern according to the method of FIG. 2, in accordance with an embodiment.

The method 200 (FIG. 2) receives a substrate 102 at operation 202. Referring to FIG. 3A, the substrate 102 includes one or more layers of material or composition. In an embodiment, the substrate 102 is a semiconductor substrate (e.g., wafer). In an embodiment, the substrate 102 includes silicon in a crystalline structure. In alternative embodiments, the substrate 102 includes other elementary semiconductors such as germanium, or a compound semiconductor such as silicon carbide, gallium arsenide, indium arsenide, and indium phosphide. The substrate 102 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment as shown in FIG. 3A, the substrate 102 includes a hard mask layer 116 for patterning one or more layers 110 thereunder. In an embodiment, the hard mask layer 116 includes nitrogen (N). In an embodiment, the hard mask layer 116 uses titanium nitride (TiN), silicon nitride (SiN), silicon oxynitride (SiON), silicon carbon nitride (SiCN), or a combination thereof. The hard mask layer 116 may be formed by a variety of processes. For example, the hard mask layer 116 may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method. In an embodiment, the hard mask layer 116 includes SiN formed by chemical vapor deposition (CVD). For example, the hard mask layer 116 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). In an embodiment, the hard mask layer 116 is formed and treated with a nitrogen-containing gas or chemical such that at least a top portion of the hard mask layer 116 contains nitrogen. In some embodiments, although not shown, the layer(s) 110 may include a dielectric layer, an inter-layer dielectric (ILD) layer such as an extreme low-k dielectric (ELK) layer, and/or an anti-reflective coating layer such as a nitrogen-free anti-reflective coating (NFARC) layer.

Figure 3B:
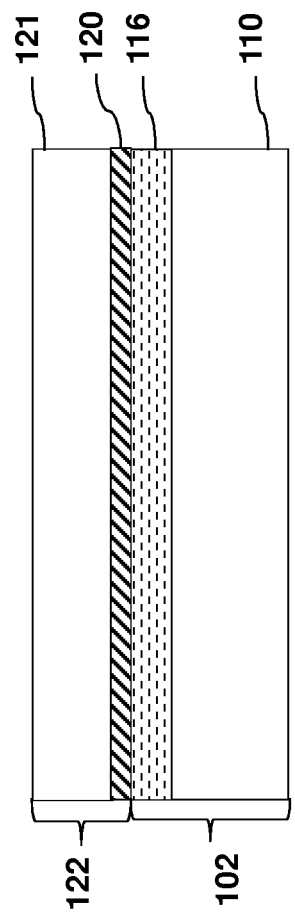

The method 200 (FIG. 2) proceeds to operation 204 by forming a resist layer 122 over the substrate 102. Referring to FIG. 3B, shown therein is the resist layer 122 formed over the substrate 102, more particularly, over the hard mask layer 116. In an embodiment, an anti-reflective coating layer is formed between the hard mask layer 116 and the resist layer 122. For example, the anti-reflective coating layer can be a polymeric material or a material selected from the group consisting of silicon oxide, silicon oxygen carbide, and plasma enhanced chemical vapor deposited silicon oxide. The resist layer 122 may be a positive resist or a negative resist. A positive resist is normally insoluble in a resist developer, but is made soluble by exposure to a radiation, such as a deep ultraviolet (DUV) ray, an extreme ultraviolet (EUV) ray, an electron beam (e-beam), or other suitable radiation. One exemplary positive resist material is chemically amplified resist (CAR) that contains backbone polymer protected by acid labile groups (ALGs). CAR further contains photo-acid generators (PAGs) which, upon radiation, produce an acid. The acid can catalyze the cleaving of the ALGs from the backbone polymer. When the ALGs leave the backbone polymer, the branch unit of the polymer will be changed to carboxylic group that increases the polymer's solubility to a positive tone developer; thus, allowing the irradiated area of the resist to be removed by a developer, while the non-irradiated area remains insoluble and becomes a masking element for subsequent processes. A negative resist has the opposite behavior—normally soluble in a resist developer, but is made insoluble by exposure to a radiation, such as a DUV ray, an EUV ray, an e-beam, or other suitable radiation. One exemplary negative resist is a polymer which forms intra-molecular and/or intermolecular cross links when irradiated, such as a polymerization of Ethyl($\alpha$-hydroxy)acrylate (EHMA) and methacryl acid (MAA).

In an embodiment, the resist layer 122 is formed by a resist coating process followed by a soft baking process. Also shown in FIG. 3B, a layer 120 of resist scum is formed in a first portion of the resist layer 122 that is between a second portion 121 of the resist layer 122 and the hard mask layer 116. The layer 120 of resist scum (referred to as the resist scum 120 hereafter) may be formed by a variety of processes. For example, nitrogen from the hard mask layer 116 or another layer underneath the resist layer 122 may arise during and/or after the resist coating process. The nitrogen reacts with the resist layer 122 to form amine ($NH_x$) resist scum 120. The resist scum 120 may comprise a polymer including the $NH_x$. In an embodiment, the resist scum 120 has a substantially uniform thickness, e.g., about 9 nanometer, over the hard mask layer 116. The resist scum 120 no longer possesses the same characteristics as the resist 121. For example, when the resist layer 122 is irradiated, photochemical reaction will occur in the resist 121, but not in the resist scum 120, and the solubility of the resist scum 120 is largely unaffected by photo-acid generation activity in the resist 121.

Figure 3C:
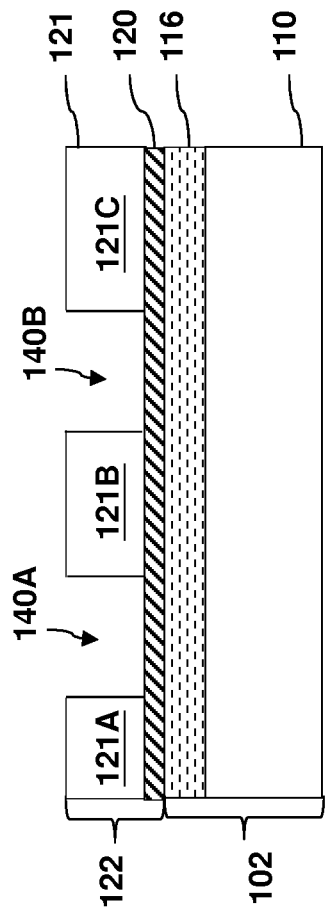

The method 200 (FIG. 2) proceeds to operation 206 by patterning the resist layer 122, for example, with a mask (or a photo-mask or a reticle). Referring to FIG. 3C, the resist layer 122, more particularly the resist 121, is patterned to include trenches 140A and 140B. In the present embodiment, patterning the resist 121 includes exposing the resist 121 to a radiation, post-exposure baking, developing the resist 121 in a resist developer, and hard baking. The radiation may be a DUV ray, an extreme ultraviolet (EUV) ray, an electron beam (e-beam), an x-ray, an ion beam, or other suitable radiation. The mask used to pattern the resist 121 can be of different types, such as a transmissive mask or a reflective mask, and can be formed in various technologies, such as binary mask or phase shift mask (PSM). In one example, a binary mask includes a transparent substrate (e.g., fused quartz), and an opaque material (e.g., chromium) coated in the opaque regions of the mask. In another example, a PSM includes various features configured to have proper phase difference to enhance the resolution and imaging quality. In an embodiment, the resist 121 is patterned using a maskless lithography technique, such as e-beam direct write (EBDW). In an embodiment, the resist 121 is a positive resist and the exposure causes photochemical reaction to occur within the positive resist 121 such that exposed portion of the positive resist 121 becomes soluble in a resist developer, such as tetramethylammonium hydroxide (TMAH). However, the resist scum 120 remains insoluble in the resist developer. When the exposed portion of the positive resist 121 is stripped to form the trenches 140A and 140B, the resist scum 120 substantially remains over the hard mask layer 116 and provides a floor for the trenches 140A and 140B. A plurality of resist patterns 121A, 121B, and 121C are thereby formed and provide sidewalls for the trenches 140A and 140B. In another embodiment, the resist 121 is a negative resist and the above patterning process is similarly applied except that unexposed portion of the negative resist 121 is removed by the patterning process. In either positive resist or negative resist case, the resist scum 120 remains substantially changed by the patterning process and provides a floor for the trenches 140A and 140B. One benefit of the present disclosure can be explained by comparing the resist patterns 121A-C shown in FIG. 3C with those in FIGS. 1A and 1B. Due to the presence of the resist scum 120, the resist patterns 121A-C do not suffer as much adhesion problem as those in FIGS. 1A and 1B. One reason is that the resist patterns 121A-C stand over a layer (the resist scum 120) that contains similar material to the resist patterns, while the resist patterns 122A (FIG. 1A) and 122B (FIG. 1B) stand over a layer that contains very different material from the resist patterns. Therefore, the resist patterns 121A-C are less susceptible to pattern collapsing. In addition, as will be discussed below, the resist 121 can be made thinner than the resist 122A (FIG. 1A) because the resist 121 primarily serves as a patterning layer, not as an etch mask.

Figure 3D:
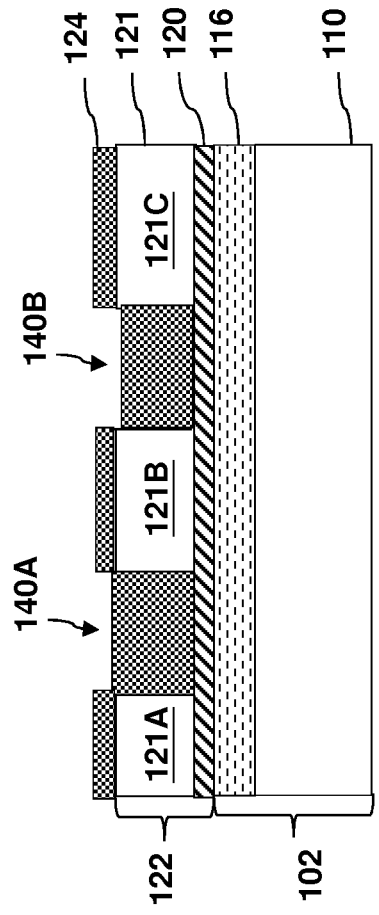
Figure 4A:
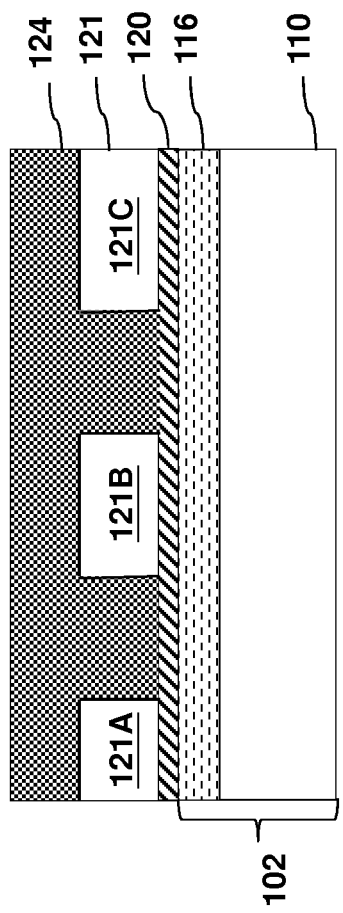
FIGS. 4A and 4B are cross sectional views of forming a target pattern according to the method of FIG. 2, in accordance with an embodiment.
Figure 4B:
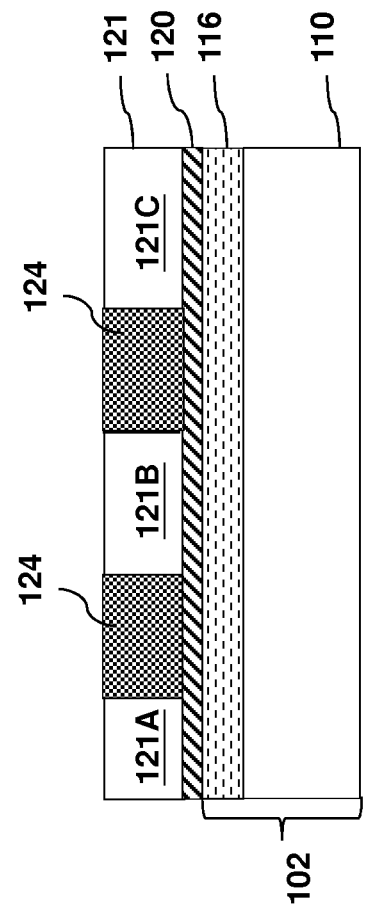

The method 200 (FIG. 2) proceeds to operation 208 by forming a material layer 124 in the trenches 140A and 140B, wherein the material layer 124 has a higher etch resistance (a lower etch rate) than the resist 121. In an embodiment, the material layer 124 contains silicon or a metal. For example, the material layer 124 may be a mixture including organosiloxane resin (from about 1% to about 40% by volume), oxalic acid (less than 0.2% by volume), water (less than 6% by volume), propylene glycol monoethyl ether (PGEE) (from about 45% to 90% by volume), and propylene glycol monomethyl ether acetate (PGMEA) (from about 5% to 15% by volume). In an embodiment, the material layer 124 is formed by a spin-on coating process, as shown in FIG. 3D. Due to the spin-on coating process, a substantially thicker portion of the material layer 124 is formed in the trenches 140A and 140B than on a top surface of the resist patterns 121A-C. The material layer 124 can be formed by other coating processes. In another embodiment, the material layer 124 is formed by a process that includes a deposition process followed by an etch-back process, as shown in FIGS. 4A and 4B. FIG. 4A shows that the material layer 124 is deposited in the trenches and over the resist patterns 121A-C. The material layer 124 may contain oxide or a metal and is deposited using an atomic layer deposition (ALD), a chemical vapor deposition (CVD), a physical vapor deposition (PVD), or other suitable deposition method. FIG. 4B shows that the material layer 124 is partially removed to expose the top surface of the resist patterns 121A-C. In an embodiment, this is done by an etch-back process which may use a wet etching, a dry (plasma) etching, and/or other etching methods. In another embodiment, this is done by a chemical mechanical polishing (CMP) process.

Figure 3E:
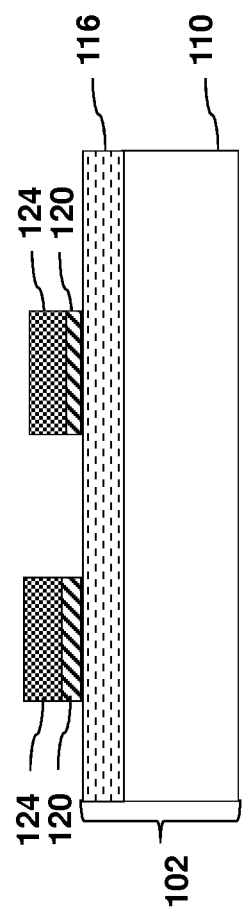

The method 200 (FIG. 2) proceeds to operation 210 to apply an etching process to the material layer 124 and the resist layer 122 to expose the hard mask layer 116, Because the material layer 124 contains silicon or a metal, it possesses a higher etch resistance (i.e., lower etch rate) than that of the resist 121 and the resist scum 120, both of which are primarily polymeric. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may use a photoresist stripper, an aqueous alkaline solution, an amine-solvent mixture, or an organic solvent. In an embodiment, the etching process is an anisotropic etching. The etching process removes the resist patterns 121A-C (FIG. 3D or FIG. 4B) and a portion of the resist scum 120 that is underneath the resist patterns 121A-C thereby resulting in one or more patterns over the hard mask layer 116 (FIG. 3E). The pattern includes a portion of the material layer 124 over a remaining portion of the resist scum 120, as shown in FIG. 3E.

Figure 3F:
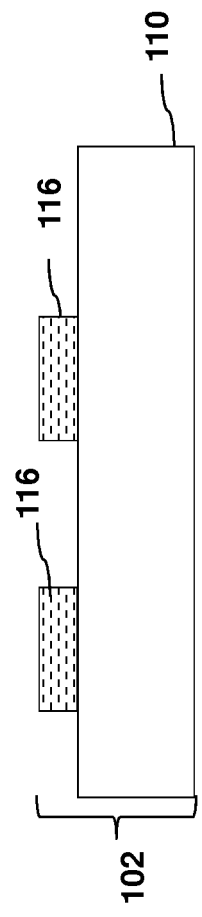

The method 200 (FIG. 2) proceeds to operation 212 to transfer the pattern from the material layer 124 and the resist scum 120 to the substrate 102, more particularly, to the hard mask layer 116. In an embodiment, this is accomplished by etching the hard mask layer 116 with the patterned layers 124/120 as an etch mask. The etching process may include a dry (plasma) etching, a wet etching, and/or other etching methods. The patterned layers 124/120 are subsequently removed, resulting in a pattern in the hard mask layer 116, as shown in FIG. 3F. One benefit of the present disclosure can be made by comparing the etch mask 124/120 of FIG. 3E with the etch mask 122A (FIG. 1A) and the etch mask 122B (FIG. 1B). Because the material layer 124 contains silicon or a metal, the etching process can be made highly selective to the hard mask layer 116. For example, various parameters of the etching process can be tuned (such as etchants used, etching temperature, etching solution concentration, etching pressure, source power, radio frequency (RF) bias voltage, RF bias power, etchant flow rate, and other suitable parameters) to etch the hard mask layer 116 much faster than the material layer 124. As a result, the desired pattern dimensions are well preserved during the etching process. For example, pattern line end to line end distance, often a critical dimension of an IC, does not enlarge during the etching process. In contrast, the etch mask 122A and 122B are photoresist and are etched away when the hard mask layer 116A and 116B are respectively etched, resulting in undesirably enlarged line end to line end distance. Therefore, compared with the lithography processes of FIG. 1A and FIG. 1B, the present disclosure provides better performance in pattern transfer.

The method 200 (FIG. 2) proceeds to operation 214 to form a final pattern or device with the patterned hard mask layer 116. In an embodiment, a target pattern is to be formed as metal lines in a multilayer interconnection structure. For example, the metal lines may be formed in an inter-layer dielectric (ILD) layer of the substrate 102. In such a case, the operation 214 forms a plurality of trenches in the ILD layer using the patterned mask layer 116; fills the trenches with a conductive material, such as a metal; and polishes the conductive material using a process such as chemical mechanical polishing to expose the patterned ILD layer, thereby forming the metal lines in the ILD layer.

In another embodiment, the operation 214 forms fin field effect transistor (FinFET) structures on a semiconductor substrate using the patterned mask layer 116. In this embodiment, the operation 214 forms a plurality of trenches in the semiconductor substrate 102. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

In another embodiment, the operation 214 forms contacts on a semiconductor substrate 102 using the patterned hard mask layer 116 and the contacts provide interconnection to one or more of the interconnect layers of a multilayer interconnect. In this embodiment, the operation 214 forms a plurality of trenches in an ILD layer of the semiconductor substrate 102 and fills the trenches with a conductive material to form vias. The conductive material may include tungsten or other suitable conductive element. In an embodiment, the contacts provide electrical connection to source/drain regions and/or gate structures in the semiconductor substrate.

The present disclosure provides many benefits. For example, resist patterns formed with some embodiments of the present disclosure have better adhesion to the layer thereunder. As such, the resist patterns are less susceptible to resist pattern collapsing issues. For example, the present disclosure uses a silicon or metal containing material layer, not the resist layer, as an etch mask for etching a hard mask layer underneath the resist layer. Therefore, the resist layer generally can be made thinner than that used in traditional photolithography processes, resulting in more desirable aspect ratio in the resist patterns. This further strengthens the resist patterns against resist pattern collapsing issue. In addition, the etching process can be tuned to remove the hard mask layer while preserving the silicon or metal containing material layer, resulting in better critical dimension in the patterns thus transferred. For example, an embodiment of the present disclosure uses two layers (a resist layer and a silicon or metal containing material layer) for lithography, which is more cost-effective than the traditional tri-layer lithography. Those of ordinary skill in the art should appreciate that some embodiments of the present disclosure may be implemented with single layer, bi-layer, or tri-layer lithography. In fact, the specific embodiments discussed so far are only examples and do not limit the inventive scope of the present disclosure beyond what is explicitly recited in the claims.

In one exemplary aspect, the present disclosure is directed to a method of patterning a substrate. The method includes forming a resist layer over the substrate, wherein a layer of resist scum forms in between a first portion of the resist layer and the substrate. The method further includes patterning the resist layer to form a plurality of trenches in the first portion, wherein the layer of resist scum provides a floor for the plurality of trenches. The method further includes forming a first material layer in the plurality of trenches, wherein the first material layer has a higher etch resistance than the resist layer and the layer of resist scum. The method further includes etching the first material layer, the resist layer, and the layer of resist scum, thereby forming a patterned first material layer over a patterned layer of resist scum over the substrate.

In another exemplary aspect, the present disclosure is directed to a method of forming a pattern for an integrated circuit. The method includes providing a substrate over which a hard mask layer is formed, the hard mask layer containing nitrogen (N). The method further includes forming a resist layer over the hard mask layer, wherein a layer of resist scum forms in a first portion of the resist layer that is between a second portion of the resist layer and the hard mask layer. The method further includes exposing the resist layer to a radiation for patterning, and developing the resist layer in a developer to form trenches in the second portion, wherein the layer of resist scum remains substantially insoluble in the developer. The method further includes filling a first material in the trenches, wherein the first material has a higher etch resistance than the resist layer, and etching the first material, the resist layer, and the layer of resist scum to expose the hard mask layer thereby forming a first pattern with a portion of the first material over a portion of the layer of resist scum over the hard mask layer. In yet another exemplary aspect, the present disclosure is directed to a method of forming a pattern for an integrated circuit. The method includes forming a resist layer over a substrate, wherein a layer of substantially uniform resist scum is formed in a first portion of the resist layer adjacent to the substrate. The method further includes forming trenches in a second portion of the resist layer that is over the first portion, wherein the first portion provides a floor for the trenches. The method further includes forming a material layer in the trenches, wherein the material layer has a higher etch resistance in an etching process than that of the resist layer. The method further includes applying the etching process to the resist and material layers to expose the substrate, resulting in a patterned material layer over a portion of the resist layer over the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a substrate, the method comprising:
    forming a resist layer over the substrate, wherein a layer of resist scum forms in between a first portion of the resist layer and the substrate;
    patterning the resist layer to form a plurality of trenches in the first portion, wherein the layer of resist scum provides a floor for the plurality of trenches;
    forming a first material layer in the plurality of trenches, wherein the first material layer has a higher etch resistance than the resist layer and the layer of resist scum; and
    etching the first material layer, the resist layer, and the layer of resist scum, thereby forming a patterned first material layer over a patterned layer of resist scum over the substrate.

2. The method of claim 1, wherein the first material layer contains silicon or a metal.

3. The method of claim 1, wherein the resist layer is a positive photo resist.

4. The method of claim 1, further comprising, before the forming the resist layer:

forming a hard mask layer between the substrate and the resist layer.

5. The method of claim 4, wherein the hard mask layer includes one of: titanium nitride (TiN), silicon nitride (SiN), silicon oxynitride (SiON), silicon carbon nitride (SiCN), and a combination thereof.

6. The method of claim 4, wherein the hard mask layer includes nitrogen.

7. The method of claim 6, wherein the forming the resist layer includes:
  coating the resist layer over the hard mask layer; and
  allowing nitrogen from the hard mask layer to react with the resist layer thereby forming the layer of resist scum.

8. The method of claim 1, further comprising:
  etching the substrate using the patterned first material layer and the patterned layer of resist scum as an etch mask.

9. The method of claim 1, wherein the patterning the resist layer includes:
  exposing the resist layer to a radiation; and
  developing the resist layer in a developer, wherein the layer of resist scum remains substantially insoluble in the developer.

10. The method of claim 1, wherein the forming the first material layer includes a spin-on coating process.

11. The method of claim 1, wherein the forming the first material layer includes:
  depositing the first material layer over the resist layer and in the trenches; and
  etching back the first material layer to expose a top surface of the resist layer.

12. The method of claim 11, wherein the depositing the first material layer includes an atomic layer deposition (ALD) process.

13. A method of forming a pattern for an integrated circuit, the method comprising:
  providing a substrate over which a hard mask layer is formed, the hard mask layer containing nitrogen;
  forming a resist layer over the hard mask layer, wherein a layer of resist scum forms in a first portion of the resist layer that is between a second portion of the resist layer and the hard mask layer;
  exposing the resist layer to a radiation for patterning;
  developing the resist layer in a developer to form trenches in the second portion, wherein the layer of resist scum remains substantially insoluble in the developer;
  filling a first material in the trenches, wherein the first material has a higher etch resistance than the resist layer; and
  etching the first material, the resist layer, and the layer of resist scum to expose the hard mask layer thereby forming a first pattern with a portion of the first material over a portion of the layer of resist scum over the hard mask layer.

14. The method of claim 13, wherein the radiation is one of: a DUV ray, a EUV ray, an e-beam, an x-ray, and an ion beam.

15. The method of claim 13, wherein the first material contains silicon or a metal.

16. The method of claim 13, wherein the forming the first material layer includes a spin-on coating process or a deposition process.

17. The method of claim 13, further comprising, transferring the first pattern to the hard mask layer.

18. A method of forming a pattern for an integrated circuit, the method comprising:
  forming a resist layer over a substrate, wherein a layer of substantially uniform resist scum is formed in a first portion of the resist layer adjacent to the substrate;
  forming trenches in a second portion of the resist layer that is over the first portion, wherein the first portion provides a floor for the trenches;
  forming a material layer in the trenches, wherein the material layer has a higher etch resistance in an etching process than that of the resist layer; and
  applying the etching process to the resist and material layers to expose the substrate, resulting in a patterned material layer over a portion of the resist layer over the substrate.

19. The method of claim 18, further comprising:
  etching the substrate with the patterned material layer over the portion of the resist layer as an etch mask.

20. The method of claim 18, wherein the forming the material layer includes one of:
  a spin-on coating process, and
  a deposition and etch-back process.

* * * * *